(12) United States Patent
Turchetta et al.

(10) Patent No.: US 7,944,012 B2
(45) Date of Patent: May 17, 2011

(54) ACCELERATED PARTICLE AND HIGH ENERGY RADIATION SENSOR

(75) Inventors: Renato Andrea Danilo Turchetta, Abingdon (GB); Giulio Enrico Villani, Oxford (GB); Mark Lyndon Prydderch, Farringdon (GB)

(73) Assignee: The Science and Technology Facilities Council, Oxfordshire (GB)

( * ) Notice: Subject to any disclaimer, the term of this patent is extended or adjusted under 35 U.S.C. 154(b) by 0 days.

(21) Appl. No.: 10/556,028

(22) PCT Filed: May 7, 2004

(86) PCT No.: PCT/GB2004/002014
§ 371 (c)(1),
(2), (4) Date: Nov. 8, 2005

(87) PCT Pub. No.: WO2004/099740
PCT Pub. Date: Nov. 18, 2004

(65) Prior Publication Data
US 2006/0278943 A1      Dec. 14, 2006

(30) Foreign Application Priority Data

May 8, 2003    (GB) .................................. 0310602.8
Aug. 22, 2003  (GB) .................................. 0319825.6

(51) Int. Cl.
*H01L 27/14*     (2006.01)
*H01L 31/06*     (2006.01)
*H01L 21/00*     (2006.01)

(52) U.S. Cl. ................ 257/431; 257/463; 257/E31.032; 438/48

(58) Field of Classification Search .................. 257/450, 257/461, 463, 184, 187, 192, 222, 291, 431
See application file for complete search history.

(56) References Cited

U.S. PATENT DOCUMENTS 4,399,360 A    8/1983   Fotino
(Continued)

FOREIGN PATENT DOCUMENTS

EP    0858111 A1    8/1998
(Continued)

OTHER PUBLICATIONS

Turchetta et al., "A Monolithic Active Pixel Sensor for Charged Particle Tracking and Imaging using Standard VLSI CMOS Technology," *Nuclear Instruments & Methods in Physics Research*, A 458 (2001) pp. 677-689. (preprint version).

(Continued)

*Primary Examiner* — Wael Fahmy
*Assistant Examiner* — Sarah K Salerno
(74) *Attorney, Agent, or Firm* — Birch, Stewart, Kolasch & Birch, LLP (57) ABSTRACT

An accelerated electron detector comprises an array of monolithic sensors in a CMOS structure, each sensor comprising a substrate (10), an epi layer (11), a p+ well (12) and n+ wells (13) which are separated from the p+ well (12) by the epi layer (11). Integrated in the p+ well are a plurality of NMOS transistors. The sensor also includes a deep n region (15) beneath the p+ well (12) which establishes within the epi layer a depletion layer so that on application of a biasing voltage charge carriers generated in the epi layer are caused to drift to the n+ well (13). The detector has improved radiation hardness and it therefore suitable for the detection and imaging of accelerated electrons such as in electron microscopes.

41 Claims, 5 Drawing Sheets

U.S. PATENT DOCUMENTS

| | | | |
|---|---|---|---|
| 5,471,515 A | 11/1995 | Fossum et al. | |
| 5,528,059 A * | 6/1996 | Isogai | 257/187 |
| 5,541,402 A | 7/1996 | Ackland et al. | |
| 5,587,596 A | 12/1996 | Chi et al. | |
| 5,614,744 A | 3/1997 | Merrill | |
| 5,625,210 A | 4/1997 | Lee et al. | |
| 5,841,126 A | 11/1998 | Fossum et al. | |
| 5,909,026 A | 6/1999 | Zhou et al. | |
| 5,933,190 A | 8/1999 | Dierickx et al. | |
| 5,949,483 A | 9/1999 | Fossum et al. | |
| 5,965,875 A | 10/1999 | Merrill | |
| 6,001,667 A | 12/1999 | Saitoh et al. | |
| 6,005,619 A | 12/1999 | Fossum | |
| 6,011,251 A | 1/2000 | Dierickx et al. | |
| 6,027,956 A * | 2/2000 | Irissou | 438/68 |
| 6,049,118 A * | 4/2000 | Nagano | 257/462 |
| 6,051,857 A * | 4/2000 | Miida | 257/292 |
| 6,146,957 A * | 11/2000 | Yamasaki | 438/326 |
| 6,150,683 A | 11/2000 | Merrill et al. | |
| 6,169,318 B1 | 1/2001 | McGrath | |
| 6,218,684 B1 * | 4/2001 | Kuhara et al. | 257/184 |
| 6,225,670 B1 * | 5/2001 | Dierickx | 257/431 |
| 6,235,549 B1 | 5/2001 | Bawolek et al. | |
| 6,242,743 B1 * | 6/2001 | DeVito et al. | 250/363.05 |
| 6,346,696 B1 | 2/2002 | Kwon | |
| 6,359,293 B1 * | 3/2002 | Woodward | 257/257 |
| 6,403,998 B1 * | 6/2002 | Inoue | 257/292 |
| 6,404,029 B1 * | 6/2002 | Hosokawa et al. | 257/431 |
| 6,433,374 B1 | 8/2002 | Fukunaga et al. | |
| 6,465,859 B1 * | 10/2002 | Fujiwara et al. | 257/435 |
| 6,545,303 B1 * | 4/2003 | Scheffer | 257/290 |
| 6,608,337 B2 | 8/2003 | Hynecek | |
| 6,632,701 B2 | 10/2003 | Merrill | |
| 6,656,760 B2 | 12/2003 | Schmitz et al. | |
| 6,713,796 B1 * | 3/2004 | Fox | 257/292 |
| 6,762,441 B1 * | 7/2004 | Janesick | 257/184 |
| 6,838,667 B2 * | 1/2005 | Tsuneta et al. | 850/10 |
| 7,253,019 B2 * | 8/2007 | Dierickx | 438/60 |
| 7,262,411 B2 | 8/2007 | Nguyen-Huu et al. | |
| 2002/0045306 A1 * | 4/2002 | Watanabe | 438/224 |
| 2002/0100915 A1 * | 8/2002 | Hynecek | 257/158 |
| 2003/0116717 A1 | 6/2003 | Knippelmeyer | |
| 2003/0143774 A1 * | 7/2003 | Takahashi et al. | 438/69 |
| 2006/0169910 A1 * | 8/2006 | Frosien et al. | 250/396 ML |

FOREIGN PATENT DOCUMENTS

| | | |
|---|---|---|
| EP | 0883187 A1 | 12/1998 |
| EP | 0903935 A1 | 3/1999 |
| EP | 0858212 B1 | 5/2002 |
| EP | 1391932 A1 | 2/2004 |
| EP | 1391932 A1 * | 2/2004 |
| GB | 2019085 A | 10/1979 |
| JP | 63-292670 | 11/1988 |
| JP | 03-074874 | 3/1991 |
| JP | 10-284748 | 10/1998 |
| JP | 11-31839 | 2/1999 |
| JP | 2002-203954 | 7/2002 |
| WO | WO-99/16238 A1 | 4/1999 |
| WO | WO-99/66529 A1 | 12/1999 |
| WO | WO-00/57205 A1 | 9/2000 |
| WO | WO-02/101832 A2 | 12/2002 |

OTHER PUBLICATIONS

Villani et al., Analysis and simulation of charge collection in monolithic active pixel sensors (MAPS), 8th Seminaron Innovative Particle and Radiation Detectors, Oct. 21-24, 2002, Italy.

Turchetta et al., CMOS sensors for the detection of minimum ionising particles, 2001 IEEE Workshop on CCDs and Advanced Image sensors, Nevada, Jun. 7-9, 2001.

Turchetta et al., Monolithic Activel Pixel sensors (MAPS) in a VLSI CMOS Technology, Nuclear Instruments and Methods in Physics Research A 501 (2003) pp. 251-259.

VLSI Technology, "9.4 Metallization Failure," edited by S.M. Sze, McGraw-Hill Book Company, 1983, pp. 367-368.

* cited by examiner

ACCELERATED PARTICLE AND HIGH ENERGY RADIATION SENSOR

The present invention relates to accelerated particle and high energy radiation sensor. In particular, but not exclusively, the present invention is concerned with the application of active pixel technology to charged particle detection including but not limited to accelerated electrons.

Through the 1990's active pixel sensors have been developed for visible imaging as an alternative to CCD technology. Such active pixel sensors are generally made using standard VLSI technology, usually CMOS, and consist of a photodiode integrated in a pixel together with an amplifier which buffers the charge signals generated by the photodiode. However, in the past the applications of active pixel sensors in visible imaging have been limited by their poor fill factor. That is to say only a small fraction of the pixel surface area was sensitive to incident light as a large proportion of each pixel's surface area was given over to readout circuitry. This limited the resolution of active pixel sensors arrays and rendered this technology unsuited to many imaging applications, specifically tracking applications.

Figure 1:
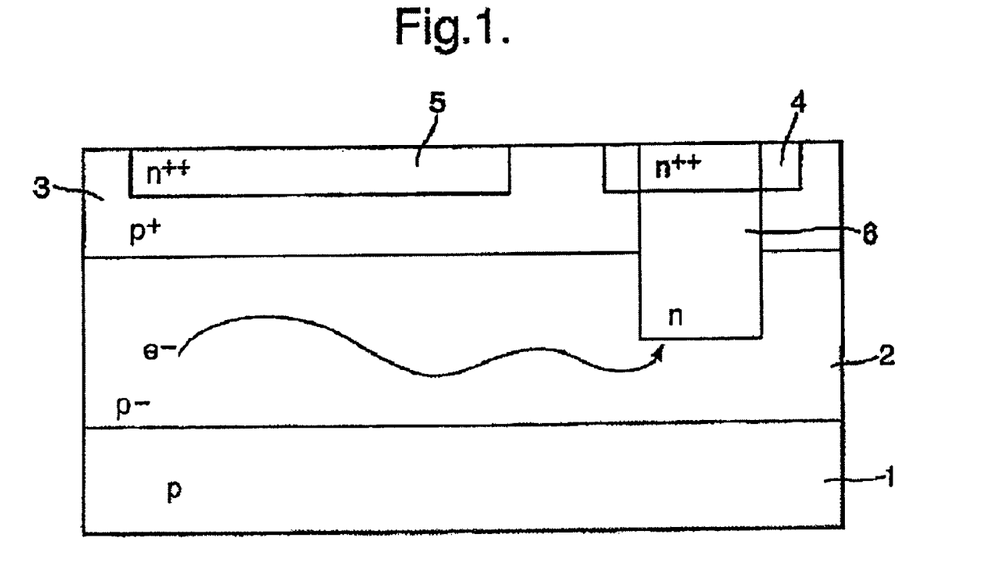
FIG. 1 illustrates schematically the structure of a known active pixel sensor.

In U.S. Pat. No. 6,225,670 an active pixel sensor structure is described for detecting electromagnetic radiation with a significantly increased fill factor. FIG. 1 is taken from U.S. Pat. No. 6,225,670 and illustrates the basic structure of one active pixel sensor. A conventional p-type doped silicon substrate 1 has a p– epi layer 2 defined in it and a p+ layer 3 formed over the epi layer 2. The p+ layer 3 includes two regions 4, 5 that have n-type doping which are separate from each other and from the epi layer 2. The first region 4, however, forms a junction with the epi layer 2 to act as a collection junction for the collection of charge carriers generated by incident electromagnetic (em) radiation and this involves a part 6 of the n-type region being driven deeper through the p+ layer and into the epi layer 2. The second n doped region 5 defines the area where the readout circuitry is located on the pixel. With this structure charge carriers are generated in the epi layer 2 as a result of incident em radiation and diffuse to the collection junction. The separation of the second n doped region 5 from the epi layer 2 by the p+ layer 3 ensures that charge carriers in the epi layer 2 are not lost to the readout circuitry.

A similar structure has also been described in a paper entitled "A monolithic active pixel sensor for charged particle tracking and imaging using standard VLSI CMOS technology" by R Turchetta et al in Nuclear Instruments & Methods in Physics Research A 458 (2001) 677-689. In this paper the possibility of using such a structure in the tracking of minimum ionising particles (MIPS) and single photon imaging is considered.

In the field of transmission electron microscopy (TEM) which employ accelerated electron beams, to date wet films continue to be used as the detectors for transmission electron microscopes in circumstances where high resolution images are required. The proposed replacement of wet films with a scintillator in combination with a fibre optic bundle and a CCD array to generate digital images has met with only limited success partly because of the smearing effects which can significantly limit the resolution of CCD detector systems. These problems are discussed in WO99/66529 which proposes deceleration of the electrons between the sample and the scintillator in an attempt to improve the resolution of the images obtained.

The present invention seeks to provide a monolithic sensor which is capable of withstanding incident accelerated particles and high energy radiation. The present invention also seeks to provide a monolithic sensor which is capable of detecting single quanta of incident accelerated particles and high energy of radiation with high efficiency, in some case substantially 100%. As such, the present invention seeks to provide a detector that is suitable for providing spatially resolved detection of charged particles that have been subjected to an externally induced acceleration for example, but not limited to, in electron microscopy.

In accordance with the present invention there is provided a monolithic sensor adapted for use in the detection of accelerated particles or high energy radiation, the sensor comprising a charge carrier transport layer, the charge carrier transport layer having dopants of a first conductivity type; at least one first well having dopants of the first conductivity type at a higher concentration than the charge carrier transport layer and having integrated therein readout circuitry; at least one second well having dopants of a second conductivity type forming a first junction with the charge carrier transport layer whereby when charge carriers are generated in the charge carrier transport layer, the charge carriers move towards and are collected at the junction between the charge carrier transport layer and the second well to generate a signal and wherein the sensor is capable of withstanding bombardment by accelerated particles or high energy radiation.

Preferably, the readout circuitry for the sensor comprises one of the following:
1) at least one n MOS transistor located in the first well; or
2) at least one p MOS transistor located in the second well; or
3) at least one n MOS transistor and at least one p MOS transistor located respectively in the first well and the second well.

More preferably, the sensor further comprising a third well having dopants of the second conductivity type which is located beneath the first well or adjacent the first well in which case an isolation layer is also provided.

The present invention has the advantage that the monolithic sensor can be manufactured using conventional CMOS technology and of achieving a substantially 100% fill factor. Furthermore, the depth of the charge carrier transport layer within the sensor and the fact that the sensor can be fully depleted, that is to say a drift field can be established in the entire sensitive volume, enables the sensor to be capable of withstanding bombardment from accelerated particles and high energy radiation, for example radiation doses in excess of 15 kRads, and charge collection can be greatly speed up in comparison to conventional ionising radiation detectors.

Thus, the sensor is particularly suited for use in electron microscopy and related analysis techniques including but not limited to: electron energy loss spectroscopy (EELS), low energy electron diffraction (LEED) and x-ray photoelectron spectroscopy.

Hence, in a further aspect the present invention provides an electron microscope comprising an evacuated housing containing an electron source, electron beam acceleration and confinement means, at least one electron beam focusing system and a detector having first and second opposed surfaces, the detector comprising an array of monolithic sensors as described above.

Embodiments of the present invention will now be described by way of example only with reference to the accompanying drawings, in which.

Wherever reference is made in the following description to n or p type material or doping it is to be understood that complementary structures generated by changing the n for p (and p for n) type material and doping, electrons for holes (and holes for electrons) and changing the biasing polarities are also envisaged. Also, like reference numerals have been used to identify structural elements common to the different active pixel sensor structures described below.

Figure 2:
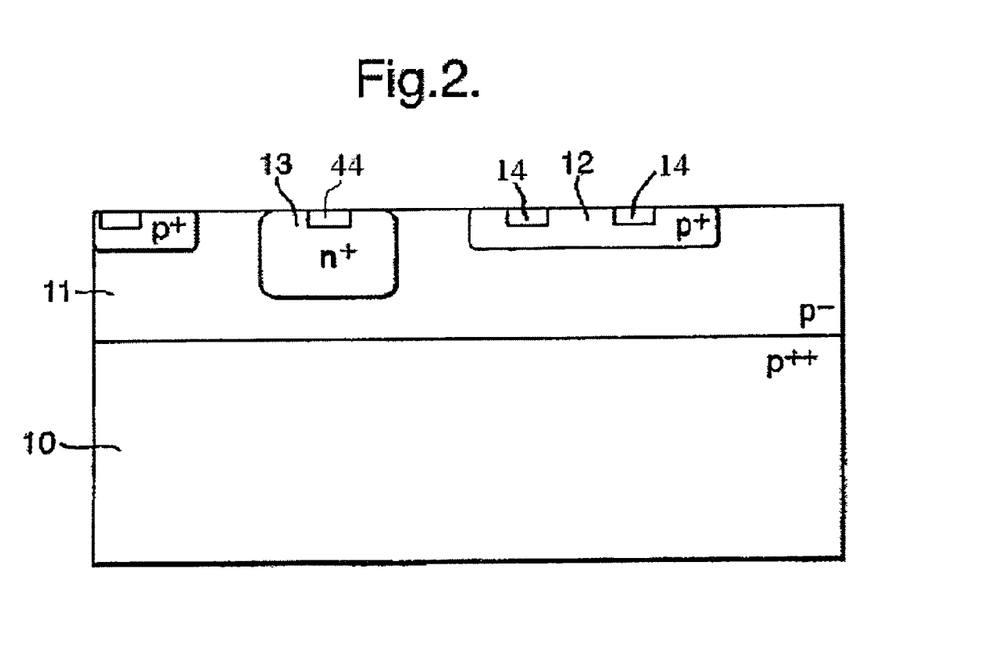
FIG. 2 illustrates schematically an improved first active pixel sensor structure.

A first monolithic structure for an active pixel sensor fabricated using CMOS technology adapted for the detection of accelerated particles is shown in FIG. 2. The structure comprises a p++ silicon substrate 10 having a thickness usually of between 300 and 700 microns which provides the support for the epitaxial p– layer 11. In the epitaxial layer 11, which usually has a thickness of between 2 and 20 microns, separate p+ and n+ wells are created in which the p+ well 12 does not touch the n+ well 13 and the n+ well 13 is surrounded by the lightly doped epitaxial layer 11. With this structure NMOS transistors 14 are fabricated within the p+ well 12, which is ideally kept at the lowest potential available in the circuit, e.g. ground. The n+ well, on the other hand, is biased at a higher potential, ideally Vdd. The continuous epitaxial layer 11 of the monolithic structure provides for substantially 100% efficiency of conversion of ionising radiation incident on the upper surface of the sensor with the charge carriers generated by the incident radiation in the epitaxial layer 11 diffusing to the n+ well 13. The small surface rectangles 44 in the n+ wells 13 in FIG. 2 (and in FIGS. 4-8) are contact regions used to improve contact to conductors leaving the wells 13.

Figure 3:
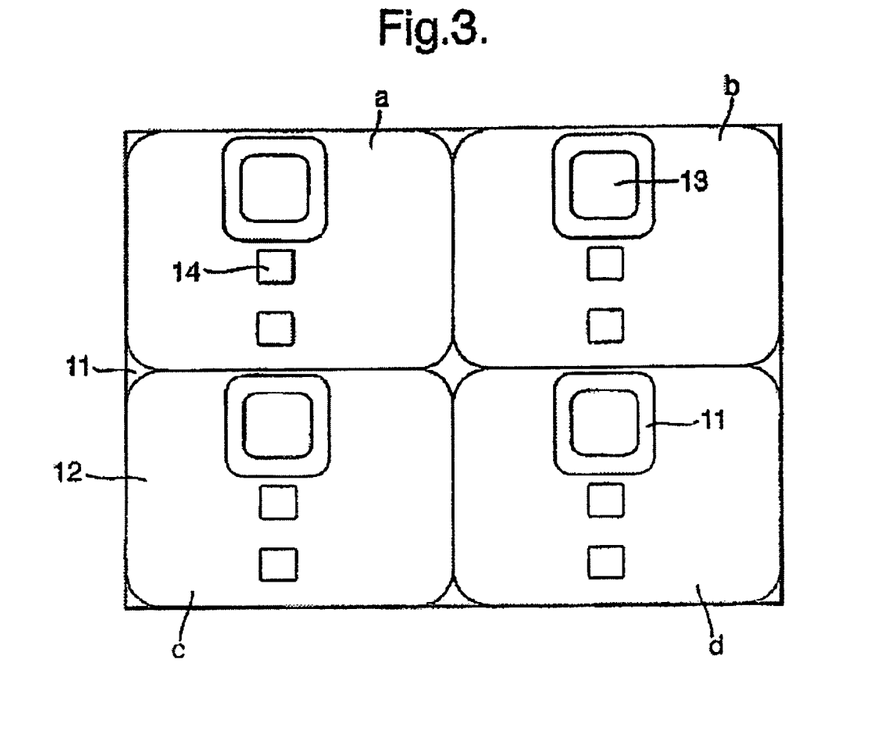
FIG. 3 illustrates schematically an array of four pixels in accordance with the structure of FIG. 2.

FIG. 3 illustrates how the structure of FIG. 2 is repeated over four pixels a, b, c, d. The isolation of the n+ well 13 from the p+ well 12 is clearly illustrated with the p–epitaxial layer 11 surrounding the n+ well 13 and forming a barrier to the p+ well 12.

Figure 4:
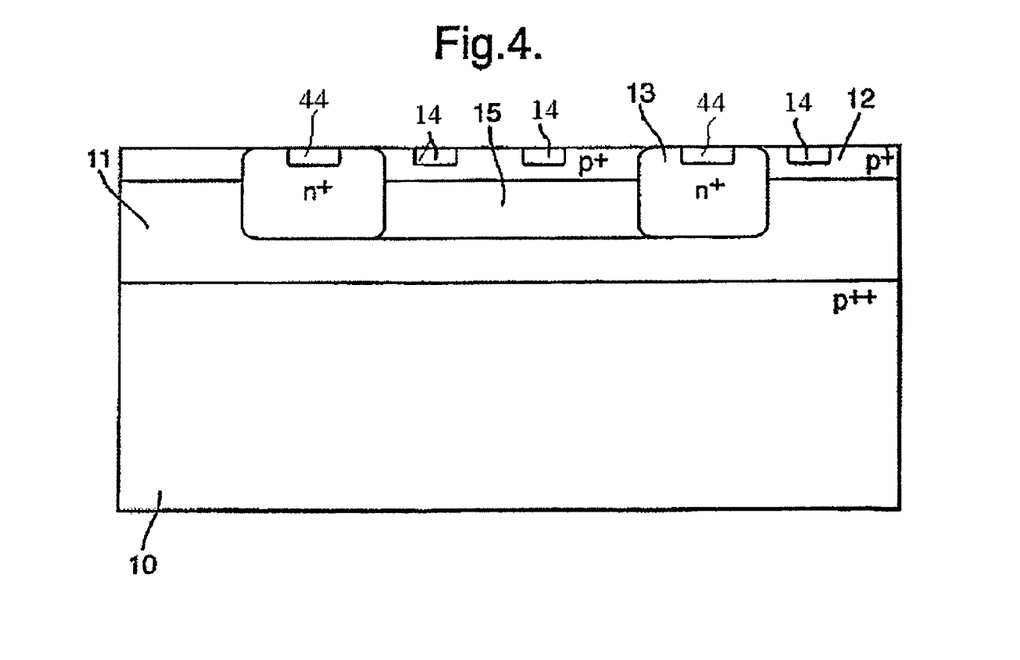
FIG. 4 illustrates schematically a second active pixel sensor structure.

A second monolithic structure for an active pixel sensor adapted for the detection of accelerated particles and high energy radiation is shown in FIG. 4. This structure includes a deep n region 15 formed beneath the p+ well 12. By means of this structure a drift field can be established substantially throughout the active volume of the epitaxial layer 11. Thus, unlike the structure of FIGS. 2 and 3 the n+ well 13 in the structure of FIG. 4 is in contact with the p+ well 12 that surrounds it. However, the n+ well 13 extends deeper into the epitaxial layer 11 than the p+ well 12 and thereby forms a collection junction with the epitaxial layer 11 below the p+ well 12. By means of the buried well, for the same size of pixel, the separation between diodes is reduced as is the thickness of the low-resistivity substrate under the diode to a size which enables a depletion region to be established throughout the volume of the epi-layer 11.

It will, of course, be understood that the extent of any depletion region established in the epi-layer 11 is dependent upon the doping levels and the applied bias. For example, following basic semiconductor theory for a typical microelectronic device having a doping level of $10^{15}$ cm$^{-3}$ and an applied bias of 3 V, the width of the depletion region would be approximately 6 μm. In the case of the monolithic structure of FIG. 4, the diodes and the thickness of the epi-layer is around or less than 6 μm thereby enabling full depletion of the epi-layer and the establishment of a drift field in which the majority of the charge carriers will drift, as opposed to diffuse, to the n+ well 13. Establishing a drift field in the sensor array also reduces cross-talk between adjacent pixels and so can improve the resolution of the array.

Figure 5:
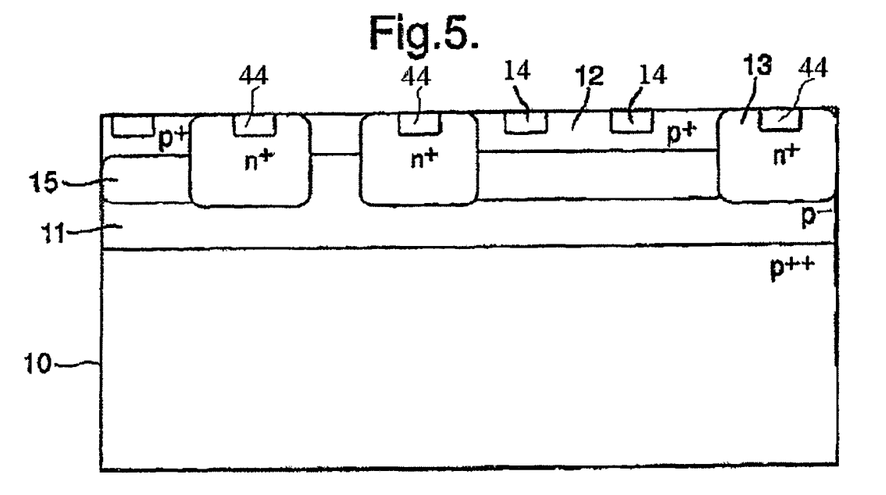
FIG. 5 illustrates schematically a plurality of integrated active pixel sensors similar to those of FIG. 4.

FIG. 5 is a variation of FIG. 4 showing how several pixels can be integrated. A 2D simulation of this structure suggests an improvement of a factor of 10 in collection time as a result of the epitaxial layer 11 being fully depleted thus making these structures particularly suitable for real-time and fast imaging. Furthermore, the structures of FIGS. 4 and 5 enable full CMOS electronics to be integrated in the pixel as NMOS transistors can be implemented in the p+ wells and PMOS transistors can be implemented in the n+ wells. In this respect it may be noted that by isolating the NMOS transistors from the substrate in the p+ well, it is possible to apply a negative bias to the p substrate without affecting the functioning of the electronics. In order to avoid leakage current, it may be necessary to add an isolation layer—see for example isolation layer 16 in FIGS. 6 and 19 in FIG. 8 (see below).

Figure 6:
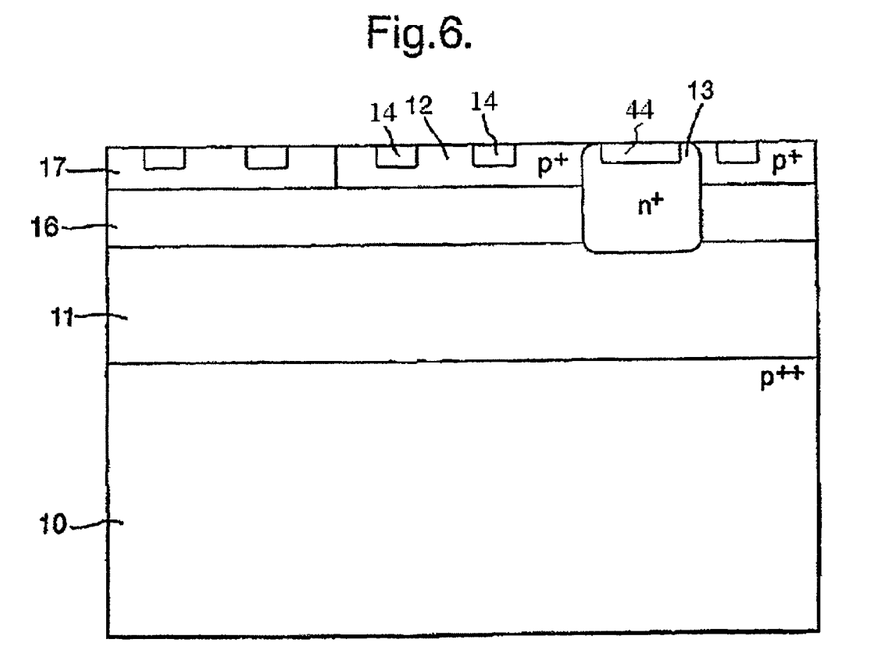
FIG. 6 illustrates schematically a third active pixel sensor structure.

A further alternative active pixel sensor structure is illustrated in FIG. 6 which permits full integration of both PMOS and NMOS transistors in a single pixel. With this structure an isolation layer 16 has been introduced to isolate the sensitive volume of the epitaxial layer 11 from the wells where the transistors are provided. In the structure of FIG. 6 the isolation layer 16 is in the form of a p++ layer which is implanted beneath the p+ well and an n+ well 17 that has been added. In order to ensure 100% collection efficiency the n+ region 13 is again implanted deep so as to extend beyond the isolation layer and form a direct junction with the epitaxial layer 11. This structure has the advantage of supporting a small collecting node and so small capacitance, high sensitivity and low noise. This structure also permits a small biasing potential to be applied by applying a negative voltage to the isolating layer 16 or to the substrate 10.

Figure 7:
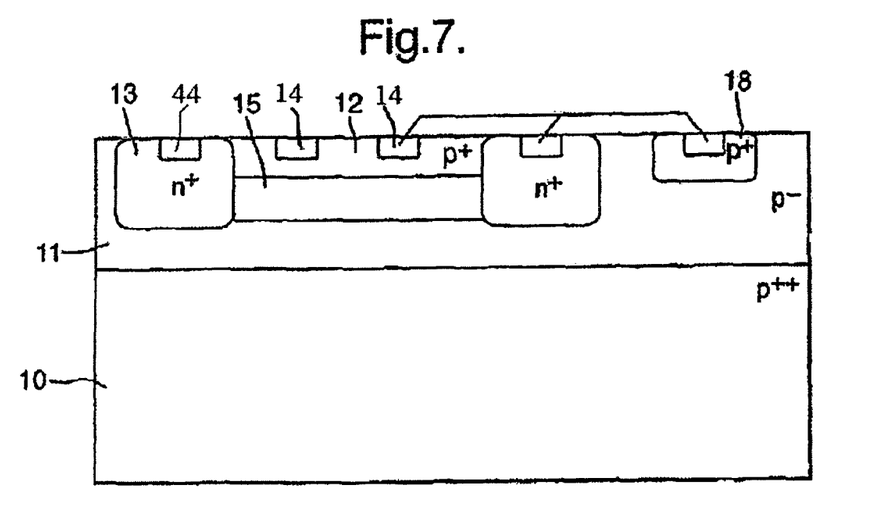
FIG. 7 illustrates schematically a fourth active pixel sensor structure.

The structure of FIG. 7 incorporates features to be found in FIGS. 4 and 5 in that an n region 15 is provided beneath the p+ well 12. In this case no isolation layer is required for integration of both PMOS and NMOS transistors in the deep n well 15 and the p+ well 12 to the left of the figure. The p+ well 18 to the right of the figure acts as a cathode, which collects majority carriers. This structure has the advantage of retaining a low capacitance of the collecting element 13 despite full CMOS electronics integration.

Figure 8:
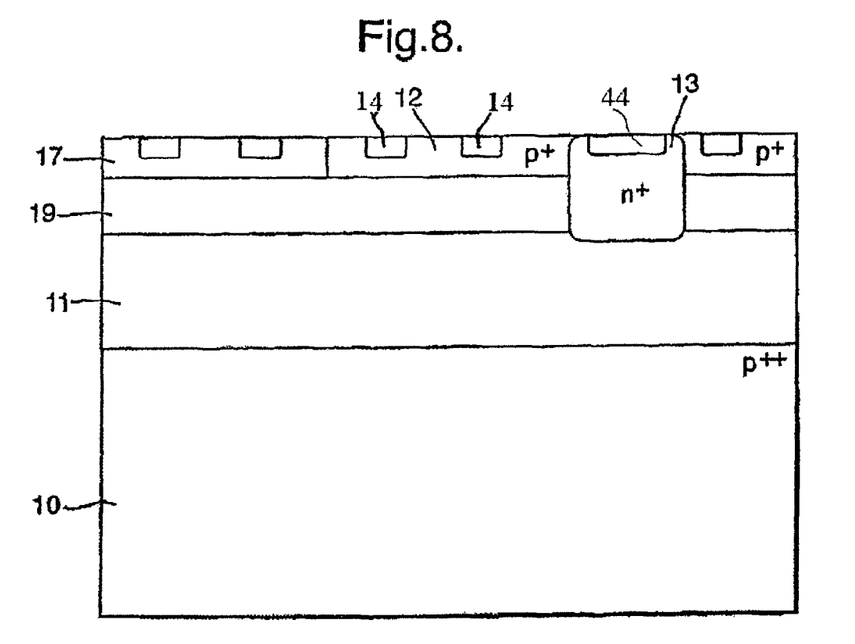
FIG. 8 illustrates schematically a fifth active pixel sensor structure.

Turning to FIG. 8 an active pixel sensor structure permitting full CMOS electronic integration is again illustrated, this time utilising a buried oxide layer 19 to isolate the electronics from the epitaxial layer 11.

All of the structures described above rely upon collection junctions for signal collection and each of the structures has a multiplicity of junctions. These junctions can be used to detect different types of accelerated particles or high energy radiation either by sequentially taking images for accelerated particles, such as electrons, having different energies and time multiplexing the output signals or by combining structures together in the same pixel to simultaneously take images for accelerated particles at different energies.

It will of course be understood that small areas of the epi-layer may be screened by metallization on top of the sensor. To address this it is envisaged that the p++ substrate 10 may be partially or fully removed and the sensor illuminated from the rear.

The active pixel sensors described above have improved radiation hardness which makes it capable of withstanding the bombardment of accelerated charged particles such as electrons and high energy radiation. In particular the present invention is capable of sustained bombardment from radiation having wavelengths equal to or shorter than 100 nm and is capable of withstanding radiation doses of 15 kRads or more. This is because as the sensor is capable of being fully depleted, the speed of collection of the charge carriers in the epi layer is reduced and this reduces signal degradation associated with the minority carrier lifetime. Moreover, it is intended that the invention be implemented using conventional VLSI CMOS technology active pixel sensor arrays which renders a resolution of around 1-5 microns possible. Hence, the sensor of the present invention may be used in radiation harsh environment, e.g. decommissioning of nuclear plants, or in satellites, e.g. for star trackers.

Figure 9:
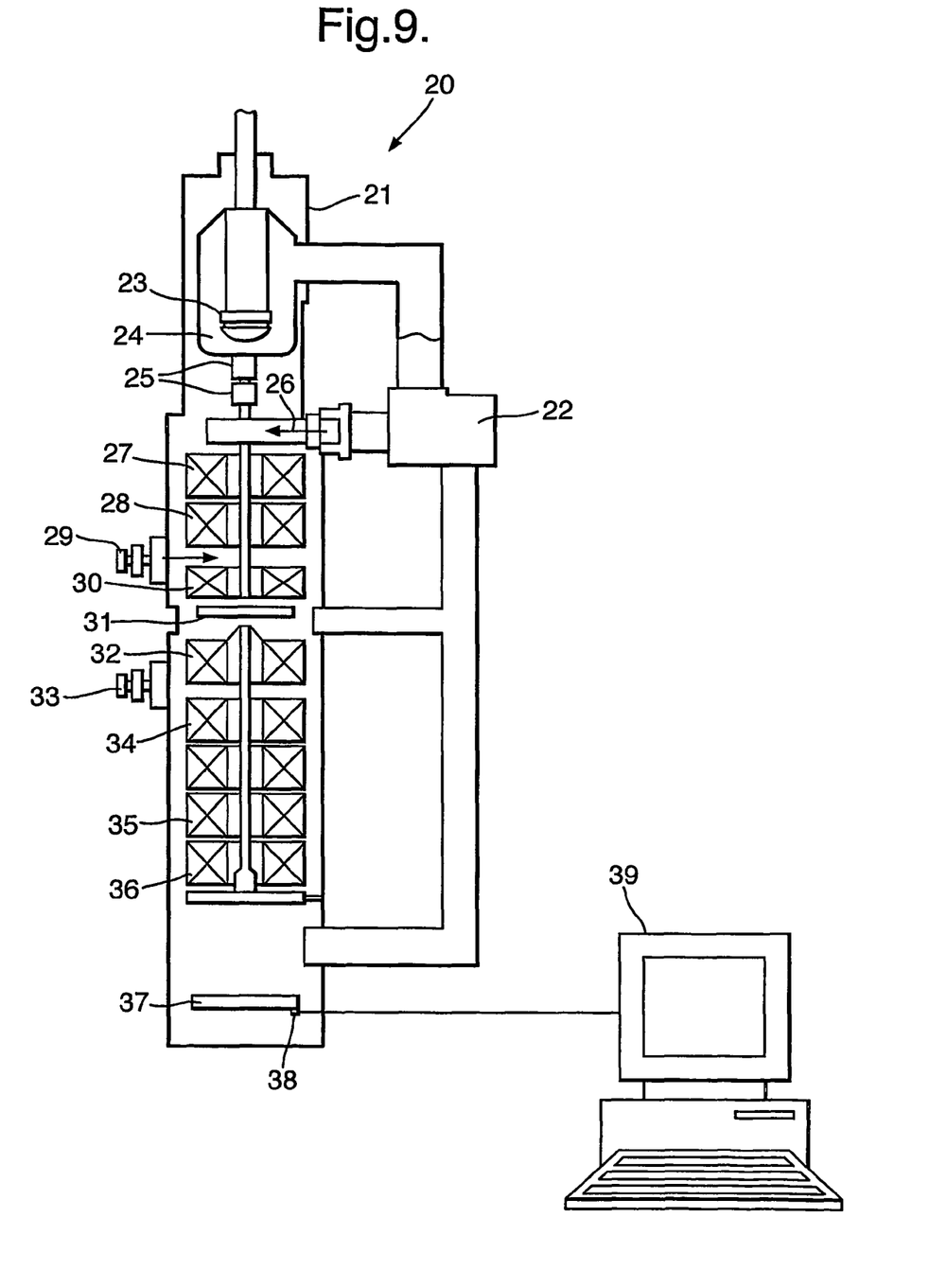
FIG. 9 illustrates schematically an electron transmission microscope incorporating an active pixel sensor array in accordance with the present invention.

A particular application for an array of active pixel sensors as described above is as the detector for a transmission electron microscope (TEM). An electron transmission microscope having an array of integrated CMOS technology sensors positioned at the focal plane of the microscope is shown in FIG. 9. The conventional features of the electron microscope are taken from GB2019085. The microscope 20 comprises a housing 21 having a vacuum pump 22 so as to maintain a high vacuum within the housing 21. Within the housing 21 an electron source 23 and its anode 24 are mounted at the top of the microscope powered from an external electrical power source. Depending upon the image resolution required the electrons may be accelerated from the source for example between 80-400 kV. Continuing along the beam axis, beyond the anode 24 is provided a beam alignment device 25, an adjustable beam aperture 26, first and second condenser lens systems 27, 28, an adjustable condenser aperture 29 and an objective lens system 30. Immediately beneath the objective lens 30 is the sample stage 31 which is transparent to incident electrons. Beneath the sample stage 31 is a second objective lens system 32, an adjustable diffraction aperture 33, and a series of lens systems including a diffraction lens 34 and first and second projection lenses 35, 36. Positioned at the bottom of the electron microscope system is the detector 37 which in this case is an array of active pixel sensors as described above with reference to FIGS. 2-8. The data output 38 of the active pixel array 37 is connected to a processor 39 for data analysis and for generating graphical images of the data supplied by the active pixel array.

The active pixel array 37 may be inverted so that the accelerated electron beam is incident on the rear substrate surface of the array and to ensure penetration of the electrons to the epitaxial layer 11, the substrate 10 may be back thinned to a thickness that permits penetration of low energy electrons. Preferably, the thickness of the substrate is reduced to a thickness of 100 microns or less. Ideally, the substrate is wholly removed leaving the rear surface of the epitaxial layer 11 exposed. Alternatively, an array of windows may be etched into the rear surface of the substrate 10 or into the front isolation layer covering the front surface of the sensor.

As a result of the high fill factor and performance characteristics of the active pixel array described above image resolutions below 5 microns can be achieved, indeed between 1 and 5 microns resolution can be achieved, which is an improvement over currently available technologies. With a reduction in pixel size and/or by implementing analogue readout of the signal with respect to individual incident electrons, sub-micron resolution is possible. This makes an electron microscope incorporating a detector having a CMOS sensor array including monolithically integrated CMOS transistors particularly but not exclusively suitable for use in the imaging of biological samples such as proteins and cell samples.

In addition to the use of the active pixel sensor array in an electron microscope, the array is suitable for use in detecting higher energy radiation including x-rays and gamma rays. Again in order to maximise the fill factor of the sensor array, the array may be reversed so that it is the rear of the substrate that is exposed to the radiation. Additionally, the rear or the front surface of the substrate may be coated in radiation sensitive material such as caesium iodide or mercuric iodide.

It will, of course, be appreciated that the present invention is not limited to the details of the structures of the active pixel sensors described herein nor is it limited to the details of the structure of the transmission electron microscope described herein. Changes and variations to those structures are envisaged whilst remaining within the scope of the present invention as claimed.

The invention claimed is:

1. A monolithic sensor adapted for use in the detection of accelerated particles or high energy radiation, the sensor comprising
   a charge carrier transport layer, the charge carrier transport layer having dopants of a first conductivity type;
   at least one first well having dopants of the first conductivity type at a higher concentration than the charge carrier transport layer and having integrated therein readout circuitry;
   at least one second well having dopants of a second conductivity type forming a first junction with the charge carrier transport layer whereby when charge carriers are generated in the charge carrier transport layer, the charge carriers move towards and are collected at the junction between the charge carrier transport layer and the second well to generate a signal and wherein the sensor is capable of withstanding bombardment by accelerated particles or high energy radiation, wherein said charge carriers do not pass through a portion of said first well located closest to said second well, wherein said first well substantially surrounds said second well, and wherein said integrated readout circuitry in said first well provides readout of said signal, and
   wherein the first and second wells are formed in the charge carrier transport layer and the second well is isolated from the first well.

2. A monolithic sensor as claimed in claim 1, wherein the charge, carrier transport layer and the first and second wells are formed in a complementary metal oxide semiconductor structure.

3. A monolithic sensor as claimed in claim 1, further comprising biasing means for applying a biasing voltage across the sensor.

4. A monolithic sensor as claimed in claim 3, wherein the charge carrier transport layer includes a drift field when the biasing voltage is applied.

5. A monolithic sensor as claimed in claim 4, wherein the charge carrier transport layer is substantially fully depleted when the biasing voltage is applied.

6. A monolithic sensor as claimed in claim 5, wherein the sensor is adapted to withstand a radiation dose of 15 kRads or more.

7. A monolithic sensor for use in the detection of accelerated particles or high energy radiation, the sensor comprising:

a charge carrier transport layer, the charge carrier transport layer having dopants of a first conductivity type and generating charge carriers from accelerated particles or high energy radiation;

at least one first well having dopants of the first conductivity type at a higher concentration than the charge carrier transport layer and having integrated therein readout circuitry;

at least one second well having dopants of a second conductivity type forming a first junction with the charge carrier transport layer so that charge carriers generated in the charge carrier transport layer move towards and are collected at the junction between the charge carrier transport layer and the second well to generate a signal as a result of detected accelerated particles or high energy radiation, wherein said first and second wells are configured to prevent said charge carriers from migrating through a portion of said first well located closest to said second well, and wherein said integrated readout circuitry in said first well provides readout of said signal; and a third well having dopants of the second conductivity type, wherein the third well is located beneath the first well.

8. A monolithic sensor as claimed in claim 1, wherein the readout circuitry for the sensor comprises one of the following:
1) at least one n MOS transistor located in the first well; or
2) at least one p MOS transistor located in the second well; or
3) at least one n MOS transistor and at least one p MOS transistor located respectively in the first well and the second well.

9. A monolithic sensor as claimed in claim 1, further comprising a semiconductor substrate and wherein the charge carrier transport layer has a lower concentration of dopants than the semiconductor substrate.

10. A monolithic sensor for use in the detection of accelerated particles or high energy radiation, the sensor comprising:

a charge carrier transport layer, the charge carrier transport layer having dopants of a first conductivity type and generating charge carriers from accelerated particles or high energy radiation;

at least one first well having dopants of the first conductivity type at a higher concentration than the charge carrier transport layer and having integrated therein readout circuitry;

at least one second well having dopants of a second conductivity type forming a first junction with the charge carrier transport layer so that charge carriers generated in the charge carrier transport layer move towards and are collected at the junction between the charge carrier transport layer and the second well to generate a signal as a result of detected accelerated particles or high energy radiation, wherein said integrated readout circuitry in said first well provides readout of said signal; and a third well having dopants of the second conductivity type, wherein the third well is located adjacent the first well and wherein an isolation layer is provided between the third well and the charge carrier transport layer and wherein the second well extends through the isolation layer to the charge carrier layer.

11. A monolithic sensor as claimed in claim 10, wherein the isolation layer comprises a semiconductor layer containing dopants of the first conductivity type at a concentration greater than the charge carrier transport layer.

12. A monolithic sensor as claimed in claim 10, wherein the isolation layer comprises an insulating dielectric.

13. A monolithic sensor as claimed in claim 1, wherein the junction between the first well and a region having dopants of the second conductivity type forms a second collection junction for generating a signal as a result of a second type of incident accelerated particles or high ionising radiation, different to the first type of accelerated particles or ionising radiation.

14. A monolithic sensor as claimed in claim 13, wherein the junction between the first and second wells forms the second junction.

15. A monolithic sensor as claimed in claim 13, wherein the first and second junctions selectively generate signals indicative of different energies of accelerated particles.

16. A monolithic sensor as claimed in claim 1, further comprising a semiconductor substrate having a thickness of 100 microns or less.

17. A monolithic sensor as claimed in claim 16, wherein said semiconductor substrate includes dopants of the first conductivity type.

18. A monolithic sensor as claimed in claim 1, wherein the rear or the front surface of the sensor array includes a layer of mercuric iodide.

19. A monolithic sensor as claimed in claim 1, wherein the rear or the front surface of the sensor array includes a layer of caesium iodide.

20. A detector comprising an integrated array of monolithic sensors as claimed in claim 1 having integrated therein readout circuitry including complementary metal oxide semiconductor devices for generating spatially resolved signals in response to bombardment by accelerated particles or high energy ionising radiation.

21. An electron microscope comprising:
an evacuated housing containing an electron source, electron beam acceleration and confinement means,
at least one electron beam focusing system, and
a detector having first and second opposed surfaces, the detector comprising an integrated array of monolithic sensors, each of said sensors comprising:
a charge carrier transport layer, the charge carrier transport layer having dopants of a first conductivity type and generating charge carriers from accelerated particles or high energy radiation;
at least one first well having dopants of the first conductivity type at a higher concentration than the charge carrier transport layer and having integrated therein readout circuitry; and
at least one second well having dopants of a second conductivity type forming a first junction with the charge carrier transport layer so that charge carriers generated in the charge carrier transport layer move towards and are collected at the junction between the charge carrier transport layer and the second well to generate a signal as a result of detected accelerated particles or high energy radiation, wherein said charge carriers do not pass through a portion of said first well located closest to said second well,
wherein the second well is isolated from the first well.

22. The monolithic sensor of claim 1, wherein said readout circuitry comprises a transistor, and wherein the second well is separated from said transistor.

23. The monolithic sensor of claim 22, wherein the transistor receives charge from the second well.

24. The monolithic sensor of claim 22, wherein the readout circuitry comprises a reset transistor that does not extend into the charge carrier transport layer.

25. The monolithic sensor of claim 24, wherein the reset transistor includes a source, a gate and a drain, and wherein the source is spaced from the first junction.

26. A monolithic sensor as claimed in claim 1, wherein said at least one second well extends deeper into said charge carrier transport layer than said at least one first well.

27. A monolithic sensor as claimed in claim 1, wherein said at least one second well extends deeper into said charge carrier transport layer than said at least one first well, and said at least one second well forms said first junction with the charge carrier transport layer at a level below said at least one first well.

28. A monolithic sensor as claimed in claim 1, wherein the charge carrier transport layer is substantially fully depleted during operation of said sensor.

29. A monolithic sensor as claimed in claim 1, further comprising:
- a third well having dopants of the second conductivity type, the third well having integrated thereon readout circuitry including at least one pMOS transistor; and
- an isolation layer between the third well and the charge carrier transport layer.

30. A monolithic sensor as claimed in claim 29, wherein the isolation layer comprises a semiconductor layer containing dopants of the first conductivity type at a concentration greater than the charge carrier transport layer.

31. A monolithic sensor as claimed in claim 29, wherein the isolation layer comprises an insulating dielectric.

32. A monolithic sensor as claimed in claim 5, further comprising:
- a third well having dopants of the second conductivity type, the third well having integrated thereon readout circuitry including at least one p MOS transistor; and
- an isolation layer between the third well and the charge carrier transport layer.

33. A monolithic sensor as claimed in claim 32, wherein the isolation layer comprises a semiconductor layer containing dopants of the first conductivity type at a concentration greater than the charge carrier transport layer.

34. A monolithic sensor as claimed in claim 32, wherein the isolation layer comprises an insulating dielectric.

35. The electron microscope of claim 21, wherein said first well substantially surrounds said second well.

36. A monolithic sensor for use in the detection of accelerated particles or high energy radiation, the sensor comprising:
- a charge carrier transport layer, the charge carrier transport layer having dopants of a first conductivity type and generating charge carriers from accelerated particles or high energy radiation;
- at least one first well having dopants of the first conductivity type at a higher concentration than the charge carrier transport layer and having integrated therein readout circuitry;
- at least one second well having dopants of a second conductivity type forming a first junction with the charge carrier transport layer so that charge carriers generated in the charge carrier transport layer move towards and are collected at the junction between the charge carrier transport layer and the second well to generate a signal as a result of detected accelerated particles or high energy radiation, wherein said first and second well are configured to prevent said charge carriers from migrating through a portion of said first well located closest to said second well, wherein said first well substantially surrounds said second well, and wherein said integrated readout circuitry in said first well provides readout of said signal,
- wherein the second well is adjacent to the first well, and a second layer different from the first well and from the charge carrier transport layer, is interposed between the first well and the charge carrier transport layer.

37. A monolithic sensor as claimed in claim 7, wherein the sensor is capable of withstanding bombardment by accelerated particles or high energy radiation.

38. A monolithic sensor as claimed in claim 10, wherein the sensor is capable of withstanding bombardment by accelerated particles or high energy radiation.

39. A monolithic sensor as claimed in claim 36, wherein the sensor is capable of withstanding bombardment by accelerated particles or high energy radiation.

40. A monolithic sensor as claimed in claim 7, wherein said first well substantially surrounds said second well.

41. A monolithic sensor as claimed in claim 10, wherein said first and second wells are configured to prevent said charge carriers from migrating through a portion of said first well located closest to said second well, and wherein said first well substantially surrounds said second well.

* * * * *